United States Patent [19]

Michel et al.

[11] Patent Number: 5,418,411
[45] Date of Patent: May 23, 1995

[54] VOLTAGE LIMITER FOR TRANSISTOR CIRCUIT

[75] Inventors: Hartmut Michel, Reutlingen; Ulrich Nelle, both of Sonnenbuehl; Anton Mindl, Tuebingen; Bernd Bireckoven, Kusterdingen, all of Germany

[73] Assignee: Robert Bosch GmbH, Stuttgart, Germany

[21] Appl. No.: 39,214

[22] Filed: Apr. 5, 1993

[30] Foreign Application Priority Data

Oct. 4, 1990 [DE] Germany .............. 40 31 350.6

[51] Int. Cl.[6] .................. H03K 5/00; H03B 1/04
[52] U.S. Cl. .................... 327/313; 327/309; 327/478; 327/482; 327/483
[58] Field of Search ............... 307/253, 254, 263, 315, 307/542, 549, 555

[56] References Cited

U.S. PATENT DOCUMENTS

| | | | |
|---|---|---|---|
| 4,461,979 | 7/1984 | Jeenicke et al. | 307/315 |
| 4,495,537 | 1/1985 | Laude/Harris | 361/98 |
| 4,516,037 | 5/1985 | Shackle | 307/315 |
| 4,564,771 | 1/1986 | Flohrs | 307/315 |
| 4,618,875 | 10/1986 | Flohrs/Bosch | 357/46 |
| 4,695,807 | 9/1987 | Annacker et al. | 307/315 |
| 4,754,158 | 6/1988 | Halberstein | 307/315 |
| 4,755,694 | 7/1988 | Bodig et al. | 307/315 |
| 5,159,213 | 8/1992 | Johnson | 307/542 |

FOREIGN PATENT DOCUMENTS

| | | |
|---|---|---|
| 0050900 | 5/1982 | European Pat. Off. |
| 3227536 | 7/1983 | Germany |
| 452666 | 3/1968 | Switzerland |

Primary Examiner—Terry D. Cunningham
Attorney, Agent, or Firm—Frishauf, Holtz, Goodman & Woodward

[57] ABSTRACT

The invention relates to a voltage limiter for a transistor circuit with semiconductors ($T_{20}$ and $T_{21}$) in the arrangement of a plurality of successive amplifier stages, with a reference element (Zener diode $Z_{20}$) and with at least one voltage divider arrangement (voltage divider $R_{21}/R_{22}$). In accordance with the invention, the reference element (Zener diode $Z_{20}$) is disposed downstream of the triggering circuit of the first stage or even closer at the output of the voltage limiter circuit for reducing the oscillation tendency.

8 Claims, 6 Drawing Sheets

VOLTAGE LIMITER FOR TRANSISTOR CIRCUIT

FIELD OF THE SPECIFICATION

The invention relates to a voltage limiter for a transistor circuit.

A known voltage limiter in an integrated circuit (DE 32 27 536 A1 and corresponding U.S. Pat. No. 4,618,875 FLOHRS), employs a controlled cover ("gate") electrode. The voltage-controlled collector voltage limiter described there corresponds to an MOS (Metal Oxide Semiconductor) structure which is generally endangered by breakdown. It is possible that the temperature compensation is not sufficient and additional process steps in the wafer process are also necessary.

Another commonly known voltage limiter in a highly blocking transistor is often formed by connecting the one side of a reference element in the form of a Zener diode to the base of the transistor. With the other side it is connected at the center tap of a voltage divider, one base of which is connected to the emitter of the transistor and the other base of which is connected to the collector of the transistor. The components of such a circuit can be separately constructed or monolithically integrated.

The limiter voltage of such an arrangement in a highly amplifying transistor (Darlington) has a pronounced tendency to oscillate, particularly if there are additional capacitances between the collector and emitter of the transistor.

If the transistor is in the form of a two-stage Darlington, the oscillation tendency can be eliminated by wiring in a capacitor or a resistor-capacitor arrangement at the voltage divider. This step is no longer effective if the voltage divider is intended to be of higher resistance, so that the transistor must be constructed as a three-stage Darlington transistor. In addition, such added wiring is practically not integratable because of the required size of the capacitance.

SUMMARY OF THE INVENTION

In accordance with the invention, it is intended to dispose the reference element downstream of the trigger circuit of the first stage or even closer at the output of the voltage limiter circuit. It has been found that it is not the number of amplifier stages via which the current taken at the voltage distribution point which is important for the oscillating tendency of an arrangement with a reference element, but the position of the reference element in the chain. The closer to the output the reference element in the form of a Zener diode is located, the less pronounced is the oscillating tendency.

If, for example, the reference element in a three-stage arrangement is inserted into the base line of the final stage transistor, the oscillating tendency is eliminated even with a two-stage Darlington amplifier connected upstream. The increased current because of the reference element does not pose problems, even in an integrated structure.

A voltage limitation is possible without MOS structures endangered by breakdown and with fewer processing steps by means of the wafer process.

DRAWINGS

The invention will be described in detail by means of the drawings:

FIG. 1. illustrates a known circuit for voltage limitation for the output of a transistor circuit for the purpose of explaining the prior art, FIG. 2a illustrates a first embodiment of a voltage limiter in accordance with the invention having NPN transistors;

FIG. 2b illustrates an embodiment corresponding to FIG. 2a with PNP transistors, FIG. 2c illustrates an embodiment in accordance with FIG. 2b with a slope forming circuit, FIG. 2d illustrates an embodiment in accordance with FIG. 2a with a slope forming circuit, FIG. 3a illustrates a second embodiment of a voltage limiter in accordance with the invention, FIG. 3b illustrates a third embodiment of a voltage limiter in accordance with the invention, FIG. 4 illustrates a first circuit variant as an independent limiter element, FIG. 5 illustrates a second circuit variant as an independent limiter element, FIG. 6 illustrates a further embodiment of the voltage limiter of the invention with a current mirror circuit.

DETAILED DESCRIPTION

In the known circuit arrangement in accordance with FIG. 1, a voltage limiter for a highly blocking transistor $T_{10}$ with a reference element in the form of a Zener diode $Z_{10}$ which is connected by one side with the base $B_{10}$ of the transistor $T_{10}$ is shown. It is connected by the other side with the center tap of a voltage divider $R_{11}/R_{12}$ consisting of resistors $R_{11}$ and $R_{12}$. The one end of the voltage divider $R_{11}/R_{12}$ is connected with the emitter $E_{10}$ of the transistor $T_{10}$ and the other end with the collector $K_{10}$.

Here, the limitation of the collector voltage takes place at:

$$U_{KE}=(U_Z+U_{BE})\cdot(1+R_{11}/R_{12}).$$

By proper selection of the resistors $R_{11}$ and $R_{12}$, a comparatively small value of $U_Z$ (Zener voltage) can be converted into a high value of $U_{KE}$.

An exact adjustment of the voltage limitation to different values becomes possible by changing the limiter ratio (function alignment).

The circuit operates in the manner shown with the provision that the base current flowing via the Zener diode to the transistor $T_{10}$ is small in comparison to the divider current through the resistors $R_{10}$ and $R_{11}$. This is frequently possible only if a two- or three-stage Darlington transistor is used as transistor $T_{10}$.

Among other things, such a multi-stage arrangement has a pronounced oscillation tendency of the limiter voltage because of the high circuit amplification, especially if additional capacitors are present between the collector $K_{10}$ and emitter $E_{10}$.

It is known to eliminate this oscillation tendency by means of C- or RC-wiring via the resistor $R_{11}$, if the transistor $T_{10}$ is a two-stage Darlington transistor.

In a highly resistive voltage divider with the three-stage Darlington transistor which is then required, oscillation cannot be eliminated from this arrangement with the additional wiring. Also, because of the required size of the capacitor C, additional wiring cannot be integrated for all practical purposes.

Circuits in accordance with the invention are shown in the following drawing figures, wherein such oscillation tendencies have been eliminated and good temperature compensation is possible. In addition, the following circuits can be well integrated.

In the circuit of the invention in accordance with FIG. 2a, both the collector $K_{20}$ and the emitter $E_{20}$ of a final stage transistor $T_{20}$ have connections with the external connectors of a voltage divider $R_{21}/R_{22}$ composed of resistors $R_{21}$ and $R_{22}$. The center tap of the voltage divider $R_{21}/R_{22}$ is connected with the base of a two-stage Darlington amplifier $T_{21}$. The collector of the latter is connected with the collector $K_{20}$ of the final stage transistor $T_{20}$ and the emitter with the base $B_{20}$ of the final stage transistor $T_{20}$ via a Zener diode $Z_{20}$.

In this case, voltage limitation takes place at:

$$U_{KE}=(U_Z+3U_{BE})\cdot(1+R_{21}/R_{22}).$$

If a Zener diode with avalanche effect is used as a reference element, it has a positive rate of the breakthrough voltage over the temperature. By adding $3U_{BE}$ to $U_Z$ it is possible to partially compensate for the temperature rate. However, it is also possible to achieve full compensation or, if desired, over-compensation with measures of circuit technology.

A corresponding voltage limiter circuit with PNP transistors is shown in FIG. 2b, while the circuit of FIG. 2a was designed with NPN transistors.

With very rapid disconnection of inductance it is possible that the voltage may rise so rapidly that undesired over-shooting occurs with entry into the voltage limitation. This interference effect can also be eliminated by the employment of an integrated slope former. In principle it can be tied to the base of any transistor in the voltage limiter circuit located upstream of the Zener element. Slope formers of this type are shown in the circuits in accordance with FIGS. 2c, 2d and FIG. 3.

The voltage limiter circuit can also be shown with PNP transistors (see FIGS. 2b, 2c, 2d). In FIG. 2c, the slope forming circuit is in the form of a capacitor at the base of the first transistor $T_{21}$. A further embodiment with a slope forming circuit is shown in FIG. 2d, in which $C_{21}$ can be formed as a capacitor or as a complete slope forming circuit, in the embodiment shown with a PNP transistor. The final stage $T_{20}$ can be in the form of a Darlington transistor or of a simple transistor.

The embodiment of 2d is particularly advantageous, because here the slope forming circuit does not need to be voltage-stable in respect to the collector $K_{20}$ and thus the concept is easier to integrate.

A complete, integratable arrangement is shown in FIG. 3. Both the collector $K_{30}$ and the emitter $E_{30}$ of a final stage transistor $T_{35}$ are connected with the exterior connectors of a voltage divider $R_{31}/R_{32}$ comprising resistors $R_{31}$ and $R_{32}$.

The collector $K_{30}$ of the final stage transistor $T_{35}$ is connected with the collector of a transistor $T_{36}$, the base of which corresponds to the base $B_{30}$ of the arrangement and the emitter of which is connected with the base of the final stage transistor $T_{35}$.

The center tap of the voltage divider $R_{31}/R_{32}$ is connected with the base of a transistor $T_{31}$, the collector of which is connected with the collector $K_{30}$ of the final stage transistor $T_{35}$ and the emitter of which is connected with the exterior connector of a further voltage divider $R_{33}/R_{34}$ comprising resistors $R_{33}$ and $R_{34}$.

The center tap of the voltage divider $R_{33}/R_{34}$ is connected with the base of a transistor $T_{32}$, the collector of which is connected with the collector $K_{30}$ of the final stage transistor $T_{35}$ and the emitter of which is connected with the other exterior connector of the voltage divider $R_{33}/R_{34}$ and, via a Zener diode $Z_{30}$ with the base of the final stage transistor $T_{35}$. The resistors $R_{32}$ and $R_{34}$ are adjustable. The Zener diode $Z_{30}$ can also be in the form of a series circuit of a resistor and a Zener diode.

A resistor $R_{35}$ with a capacitor $C_{30}$ connected downstream of it is located between the base and the collector $K_{30}$ of the final stage transistor $T_{35}$.

The center connector between the resistor $R_{35}$ and the capacitor $C_{30}$ is connected with the base of a transistor $T_{33}$, the collector of which is connected with the collector $K_{30}$ of the final stage transistor $T_{35}$ and the emitter of which is connected with the base of a further transistor $T_{34}$.

The collector of the transistor $T_{34}$ is connected with the collector $K_{30}$ of the final stage transistor $T_{35}$ and the emitter is connected via a resistor $R_{36}$ with the base of the final stage transistor $T_{35}$.

Compared with the circuit arrangement in accordance with FIG. 2, the arrangement composed of the transistors $T_{31}$ and $T_{32}$ and the resistors $R_{33}$ and 34 has taken the place of the Darlington amplifier $T_{21}$ for a precise adjustment of the temperature rate.

In this case, voltage limitation takes place at:

$$U_{KE}=(U_Z+(3+R_{33}/R_{34})\cdot(1+R_{31}/R_{32}).$$

The temperature rate can first be set at the voltage divider $R_{33}/R_{34}$; the limiter voltage subsequently at the voltage divider $R_{31}/R_{32}$.

In this case the slope former consists of the transistors $T_{33}$ and $T_{34}$ and the resistors $R_{35}$ and $R_{36}$ as well as the capacitor $C_{30}$.

The positive displacement current via the (integrated) base-collector-capacitor $C_{30}$ is amplified via the transistors $T_{33}$ and $T_{34}$ and thus reduces the speed of voltage increase at the final stage transistor $T_{35}$. Negative feedback via the resistors $R_{35}$ and $R_{36}$ is used for the exact setting of current amplification of the transistors $T_{33}$ and $T_{34}$.

In normal forward operation, the transistor $T_{35}$ is switched on via the transistor $T_{36}$, which results in the desired disconnection of the base and clamping circuits.

The transistor $T_{36}$ can also be in the form of a double Darlington or of an emitters follower with separate collector.

The function of the slope forming circuit is explained in an analog manner if it is disposed between the collector $K_{30}$ and the base of another transistor in the voltage limiter circuit, for example $T_{32}$ in accordance with FIG. 3b.

In FIG. 4, a Zener diode $C_{40}$ is disposed in the emitter line of a dual Darlington amplifier $T_{42}$ in the direction towards ground. A voltage divider $R_{41}/R_{42}$, composed of resistors $R_{41}$ and $R_{42}$, is located parallel to the collector-emitter path of the Darlington amplifier $T_{42}$ including the Zener diode $Z_{40}$.

The center tap of the voltage divider $R_{41}/R_{42}$ is connected with the base of a transistor $T_{41}$, the collector of which is connected with the collector $K_{40}$ of the Darlington amplifier $T_{42}$ and the emitter of which is connected with the exterior connector of a voltage divider $R_{43}/R_{44}$ comprising resistors $R_{43}$ and $R_{44}$.

The center tap of the voltage divider $R_{43}/R_{44}$ is connected with the base of the Darlington amplifier $T_{42}$ and the other, exterior connector of the voltage divider $R_{43}/R_{44}$ is connected with the emitter of the Darlington amplifier $T_{42}$. The resistors $R_{42}$ and $R_{44}$ are adjustable. The circuit variant employed in FIG. 4 is used as an independent limiter element.

In FIG. 5, a voltage divider $R_{51}/R_{52}$, consisting of resistors $R_{51}$ and $R_{52}$, lies parallel to the collector-emitter path of an output transistor $T_{53}$, wherein the emitter is connected with ground.

The center tap of the voltage divider $R_{51}/R_{52}$ is connected with the base of a transistor $T_{51}$ the collector of which is connected with the collector $K_{50}$ of the output transistor $T_{53}$ and the emitter of which is connected with the exterior connector of a further voltage divider $R_{53}/R_{54}$ comprising resistors $R_{53}$ and $R_{54}$.

The center tap of the voltage divider $R_{53}/R_{54}$ is connected with the base of a transistor $T_{52}$ the collector of which is connected with the collector $K_{50}$ of the output transistor $T_{53}$ and the emitter of which is connected with the other, exterior connector of the voltage divider $R_{53}/R_{54}$ and, via a Zener diode $Z_{50}$, with the base of the output transistor $T_{53}$. The resistors $R_{52}$ and $R_{54}$ are adjustable.

Figure 1:
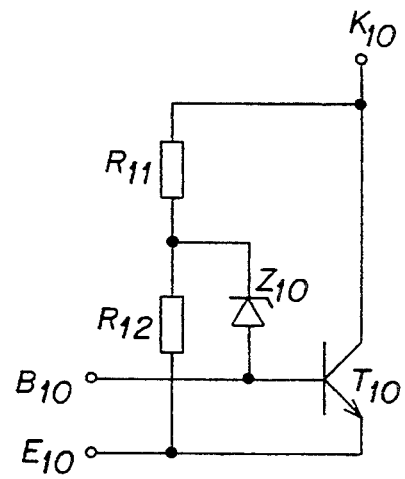
Figure 2A:
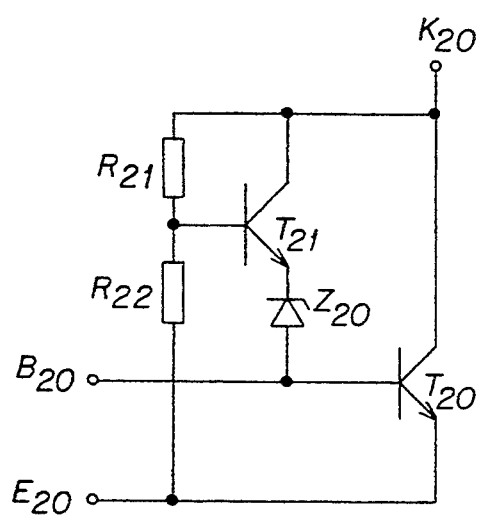
Figure 2B:
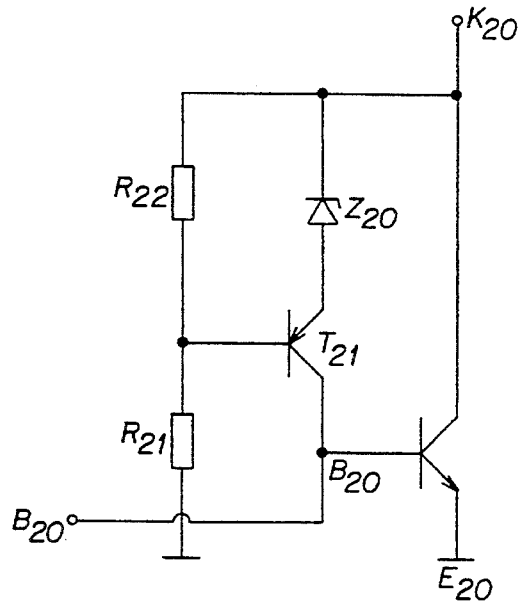
Figure 2C:
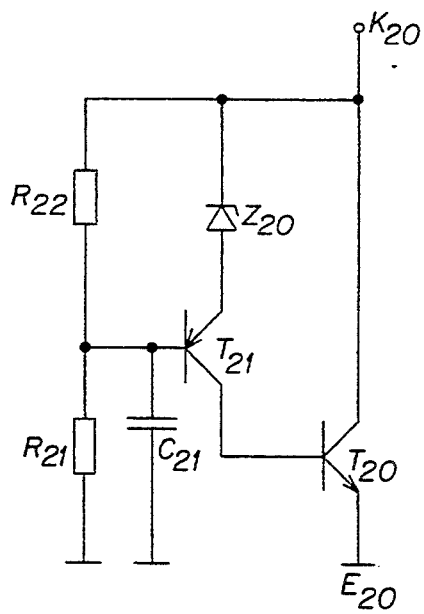
Figure 2D:
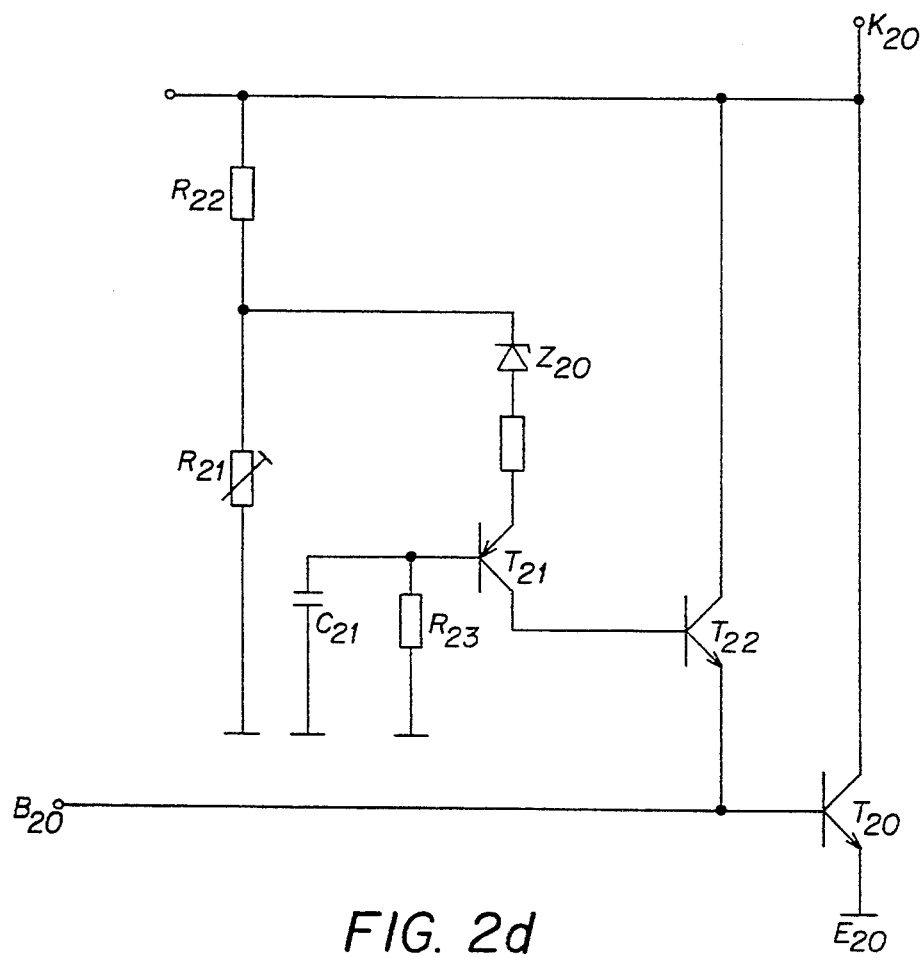
Figure 3A:
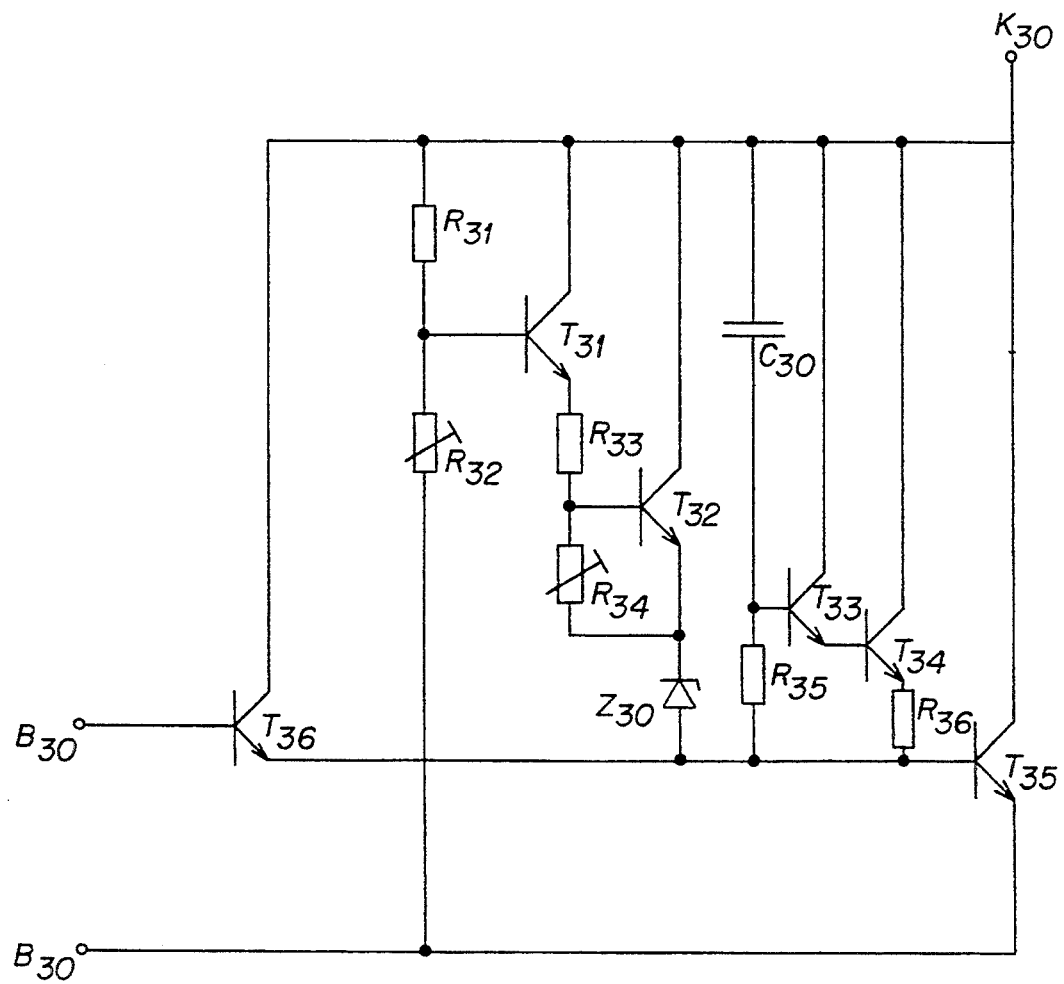
Figure 3B:
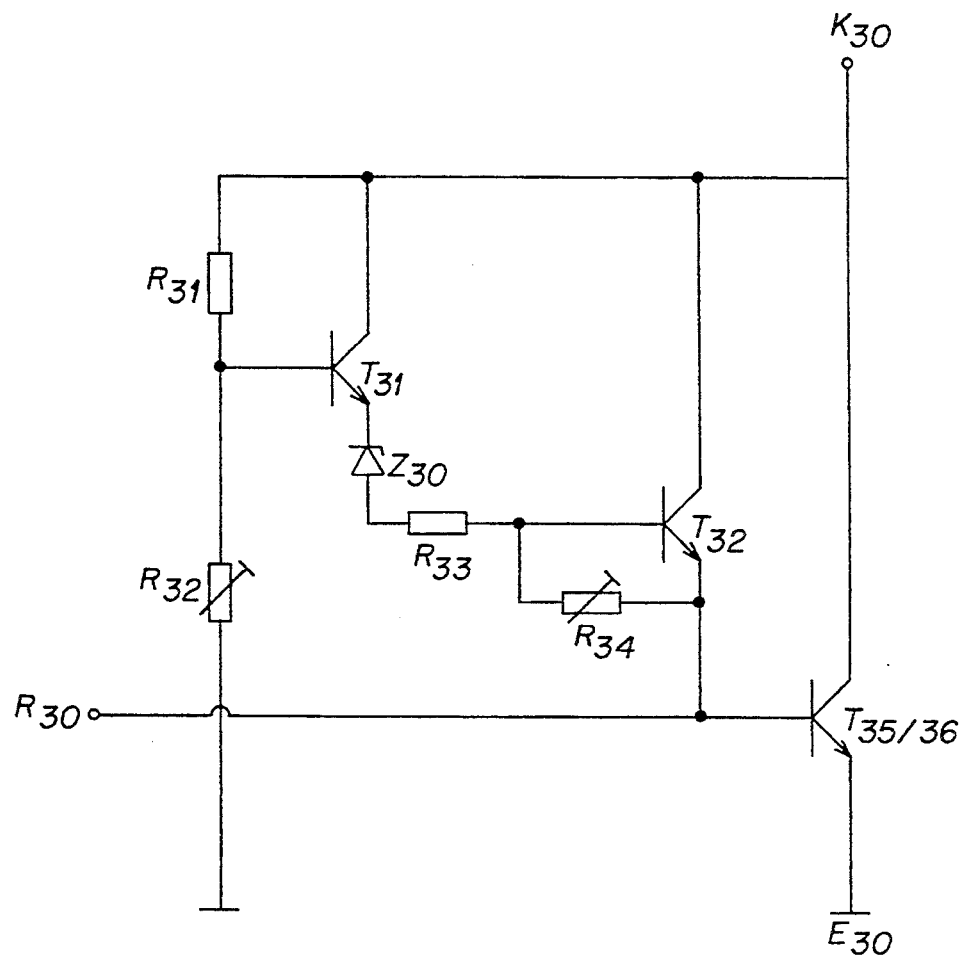
Figure 4:
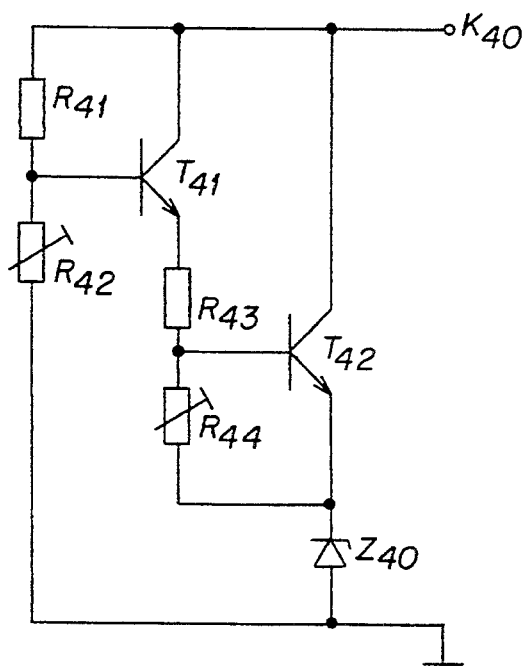
Figure 5:
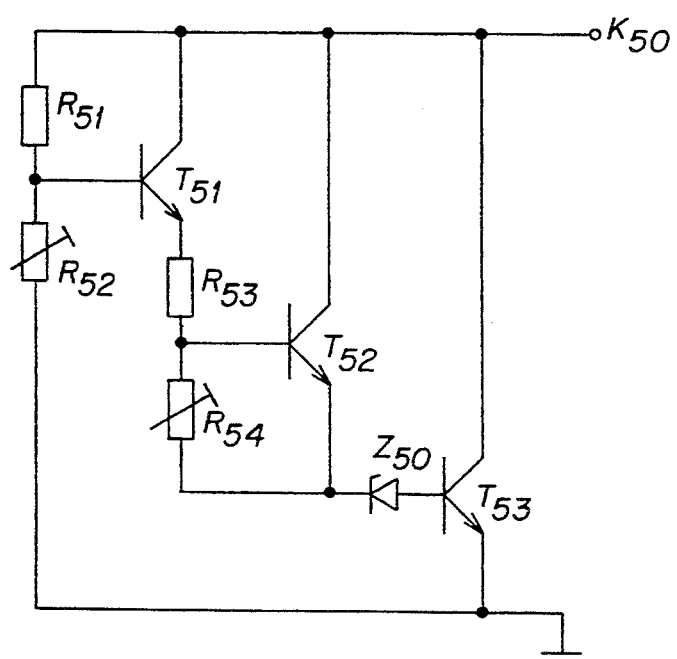
FIG. 5 shows a further circuit variant used as an independent limiter element.
Figure 6:
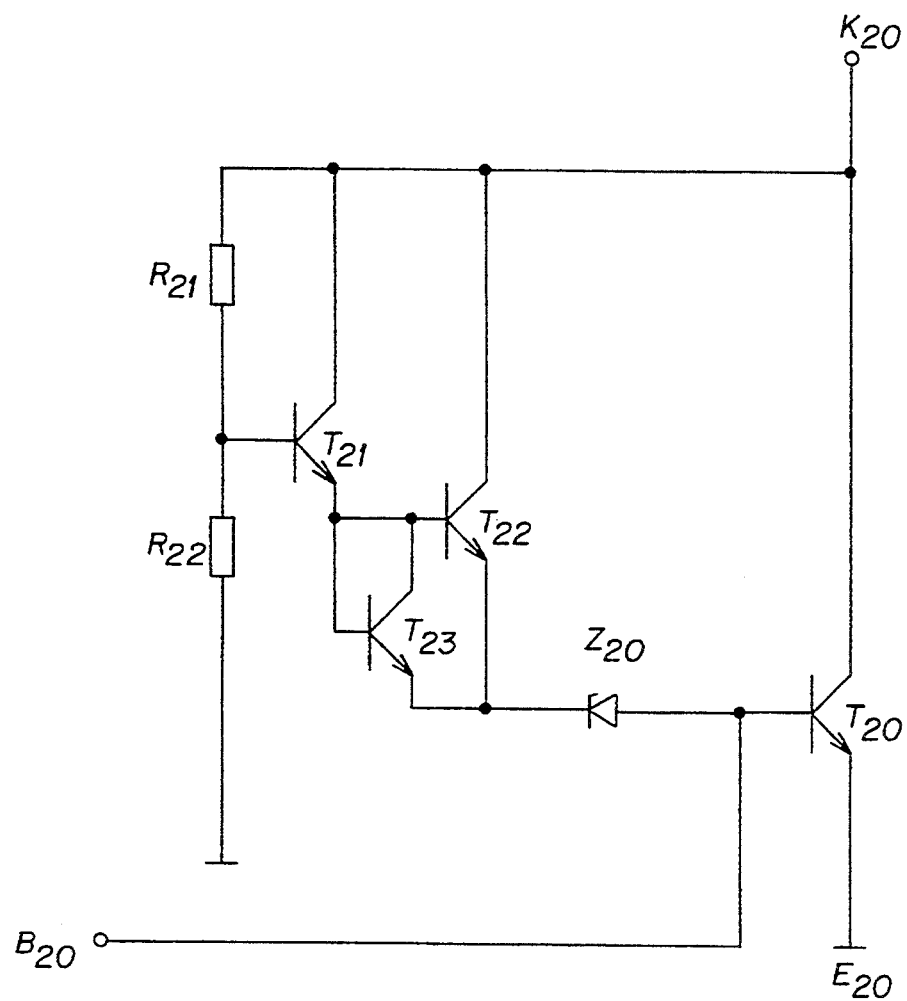
FIG. 6 shows a voltage limiter circuit containing a current mirror circuit for adjusting the current amplification.

We claim:

1. A transistor final power stage comprising:
   an NPN final stage transistor (T20, T35); and
   a voltage limiter device for limiting voltage at a collector of said final stage transistor, including:
   a voltage divider (R21, R22) coupled between the collector and an emitter of said final stage transistor;
   a Zener diode (Z20, Z30) used as voltage reference element, coupled in parallel with a collector-base path of said final stage transistors, and
   a transistor amplifier (T21; T31, T32) having its emitter-collector path coupled in series with said Zener diode (Z20, Z30),
   wherein said transistor amplifier is an NPN transistor (T21) having its base coupled to the tap of the voltage divider, its collector coupled to the collector of the final stage transistor and its emitter coupled to a cathode of said Zener diode, an anode of said Zener diode being coupled to the base of the final stage transistor,
   wherein the NPN transistor forming said transistor amplifier is a Darlington amplifier formed as a two-stage amplifier including an input transistor (T31) and an output transistor (T32 ); and
   an emitter series resistor (R33) coupled between an emitter of the input transistor and a base of the output transistor, and a further resistor (R34) coupled between the base and an emitter of the output transistor to form a further voltage divider (R33, R34).

2. A transistor final power stage comprising:
   an NPN final stage transistor (T20, T35); and
   a voltage limiter device for limiting voltage at a collector of said final stage transistor, including:
   a voltage divider (R21, R22) coupled between the collector and an emitter of said final stage transistor;
   a Zener diode (Z20, Z30), used as voltage reference element, coupled in parallel with a collector-base path of said final stage transistor, and
   a transistor amplifier (T21; T31, T32) having its emitter-collector path coupled in series with said Zener diode (Z20, Z30), and being responsive to a tap of said voltage divider,
   a resistor (R35) connected in series with a capacitor (C30) to form a series circuit coupled between the base and the collector of the final stage transistor, a junction of the resistor, (R35 ) and the capacitor (C30) being coupled to a base of an NPN transistor (T33) having its collector connected to the collector of the final stage transistor and with its emitter coupled to the base of a further NPN transistor (T34), and
   wherein the collector of the further NPN transistor (T34) is connected to the collector of the final stage transistor and an emitter of the further NPN transistor is connected via a resistor (R36) to the base of the final stage transistor.

3. A voltage limiter device for limiting the voltage at a terminal with a positive potential of a transistor circuit, comprising:
   a voltage divider (R41, R42, R51, R52) coupled between the terminal (K40, K50) and ground;
   a Zener diode (Z40; Z50), employed as a voltage reference element, coupled to ground; and
   a transistor amplifier (T41, T42, T51, T52) having its emitter-collector path connected in series with the Zener diode, and including an input transistor (T41; T51) and an output transistor (T42; T52),
   wherein an anode of the Zener diode is connected to ground and the transistor amplifier comprises an NPN arrangement with its base coupled to the tap of the voltage divider, its collector coupled to the terminal and its emitter coupled to a cathode of the Zener diode, and
   wherein a first resistor (R43; R53) is coupled between an emitter of the input transistor (T41; T51) and a base of the output transistor, and a second resistor (R44; R54) is coupled between the base and an emitter of the output transistor (T42; T52), whereby the first and second resistors form a further voltage divider (R43, R44; R53, R54).

4. A voltage limiter device in accordance with claim 3, wherein:
   the anode of the Zener diode (Z50) is connected to ground via a base-emitter path of an NPN transistor (T53), and a collector of the transistor (T53) is connected to the terminal.

5. A voltage limiter device in accordance with claim 3, wherein said output transistor is a Darlington transistor.

6. A transistor final power stage comprising:
   a final stage transistor; and
   a voltage limiter device for limiting voltage at a collector of said final stage transistor, including:
   a voltage divider coupled between the collector and an emitter of said final stage transistor,
   a Zener diode coupled in parallel with a collector-base path of said final stage transistor
   a transistor amplifier having its emitter-collector path coupled in series with said Zener diode, and including an input transistor and an output transistor, and being responsive to a tap of said voltage divider, and
   an emitter series resistor coupled between an emitter of the input transistor and a base of the output transistor, and a further resistor coupled between the base and an emitter of the output transistor to form a further voltage divider.

7. A final power stage in accordance with claim 6, wherein the transistor amplifier is a PNP transistor (T21) having its base coupled to the tap of the voltage divider (R21, R21), its collector coupled to the base (B20) of the final stage transistor and its emitter coupled to the anode of the Zener diode (Z20), said Zener diode having its cathode coupled to the collector (K20) of the final stage transistor (T20).

8. A final power stage in accordance with claim 7, wherein the PNP transistor forming the transistor amplifier is in the form of a Darlington amplifier.

* * * * *